US011962301B2

(12) United States Patent
Shen et al.

(10) Patent No.: US 11,962,301 B2
(45) Date of Patent: Apr. 16, 2024

(54) RING OSCILLATOR USING MULTI-PHASE SIGNAL REASSEMBLY

(71) Applicant: NVIDIA Corporation, San Jose, CA (US)

(72) Inventors: Chun-Ju Shen, Los Altos, CA (US); Chien-Heng Wong, Milpitas, CA (US); Ying Wei, San Jose, CA (US)

(73) Assignee: Nvidia Corporation, Santa Clara, CA (US)

( * ) Notice: Subject to any disclaimer, the term of this patent is extended or adjusted under 35 U.S.C. 154(b) by 0 days.

(21) Appl. No.: 17/891,017

(22) Filed: Aug. 18, 2022

(65) Prior Publication Data
US 2024/0063778 A1    Feb. 22, 2024

(51) Int. Cl.
| | |
|---|---|
| H03K 3/03 | (2006.01) |
| H03K 19/20 | (2006.01) |
| H03L 7/099 | (2006.01) |
| H03M 1/66 | (2006.01) |
| H03M 9/00 | (2006.01) |

(52) U.S. Cl.
CPC ......... H03K 3/0315 (2013.01); H03K 19/20 (2013.01); H03L 7/0995 (2013.01); H03M 1/66 (2013.01); H03M 9/00 (2013.01)

(58) Field of Classification Search
CPC .... H03K 3/0315; H03K 7/0995; H03K 19/20; H03M 9/00; H03M 1/66; H03L 7/0995
USPC ...................................... 331/1 A, 57, 45, 46
See application file for complete search history.

(56) References Cited

U.S. PATENT DOCUMENTS

| | | | | |
|---|---|---|---|---|
| 8,396,111 | B2* | 3/2013 | O'Malley | H02M 3/33515 375/238 |
| 8,508,309 | B2* | 8/2013 | McCune, Jr. | H03C 1/20 332/103 |
| 2022/0302918 | A1* | 9/2022 | Srivastava | G06F 1/08 |

OTHER PUBLICATIONS

A. Homayoun and B. Razavi, "Relation Between Delay Line Phase Noise and Ring Oscillator Phase Noise," in IEEE Journal of Solid-State Circuits, vol. 49, No. 2, pp. 384-391, Feb. 2014, doi: 10.1109/JSSC.2013.2289893.
A. A. Abidi, "Phase Noise and Jitter in CMOS Ring Oscillators," in IEEE Journal of Solid-State Circuits, vol. 41, No. 8, pp. 1803-1816, Aug. 2006, doi: 1109/JSSC.2006.876206.
Tak, G.Y. and Lee, K., 2017. A low-reference spur MDLL-based clock multiplier and derivation of discrete-time noise transfer function for phase noise analysis. IEEE Transactions on Circuits and Systems I: Regular Papers, 65(2), pp.485-497.

* cited by examiner

*Primary Examiner* — Arnold M Kinkead
(74) *Attorney, Agent, or Firm* — Lowenstein Sandler LLP

(57) ABSTRACT

Technologies for low jitter and low power ring oscillators with multi-phase signal reassembly are described. A ring oscillator circuit includes a ring oscillator with a set of M delay stages, each stage outputs a phase signal, where M is a positive integer greater than one. The ring oscillator circuit includes a phase selector circuit coupled to the ring oscillator. The phase selector circuit can receive M phase signals from the ring oscillator and generate N phase signals based on the M phase signals, where N is a positive integer less than M.

21 Claims, 12 Drawing Sheets

RING OSCILLATOR USING MULTI-PHASE SIGNAL REASSEMBLY

TECHNICAL FIELD

At least one embodiment pertains to processing resources used to perform and facilitate network communication. For example, at least one embodiment pertains to ring oscillators with multi-phase signal reassembly.

BACKGROUND

Communications systems transmit and receive signals at a high data rate (e.g., up to 200 Gbits/sec). High-speed transmissions exhibit significant noise attributes (e.g., due to the transmission medium) that require the use of communication devices (e.g., transmitters and receivers) configured to perform digital pre-processing by the transmitter device and post-processing by the receiver device. High-speed data transmission in data centers and between computing and storage devices is often achieved with a Serializer/Deserializer (SERDES) system. Low jitter, low power, and multi-phase clock generation are important factors in high-speed SERDES systems. In particular, low jitter and lower power are key to ensuring high-speed communication and computation. Conventionally, ring oscillators or voltage-controlled oscillators (VCO) are used in clock circuitry for various blocks of the SERDES system. Although ring oscillators have worse jitter and power performances than VCOs, ring oscillators provide some advantages, such as small area, multiple phases, wide frequency tuning range, and less coupling to surrounding circuits.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

BRIEF DESCRIPTION OF DRAWINGS

Figure 1A:
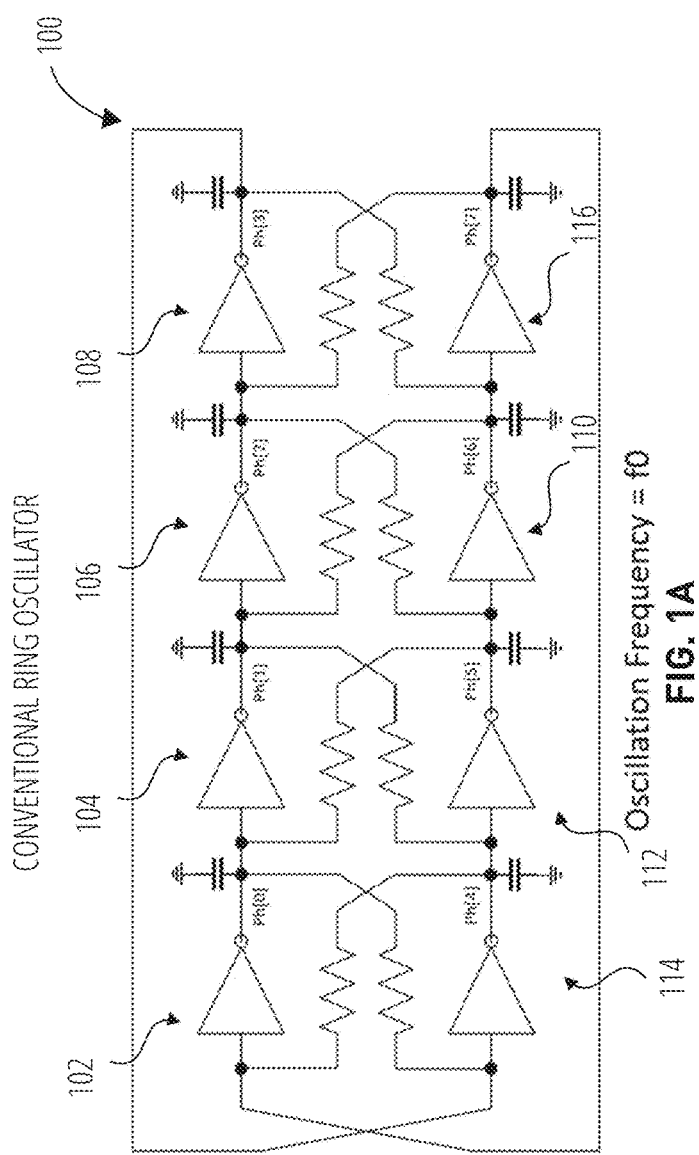

Various embodiments in accordance with the present disclosure will be described with reference to the drawings, in which:

FIG. 1A is a schematic diagram of a conventional ring oscillator according to one implementation.

Figure 1B:
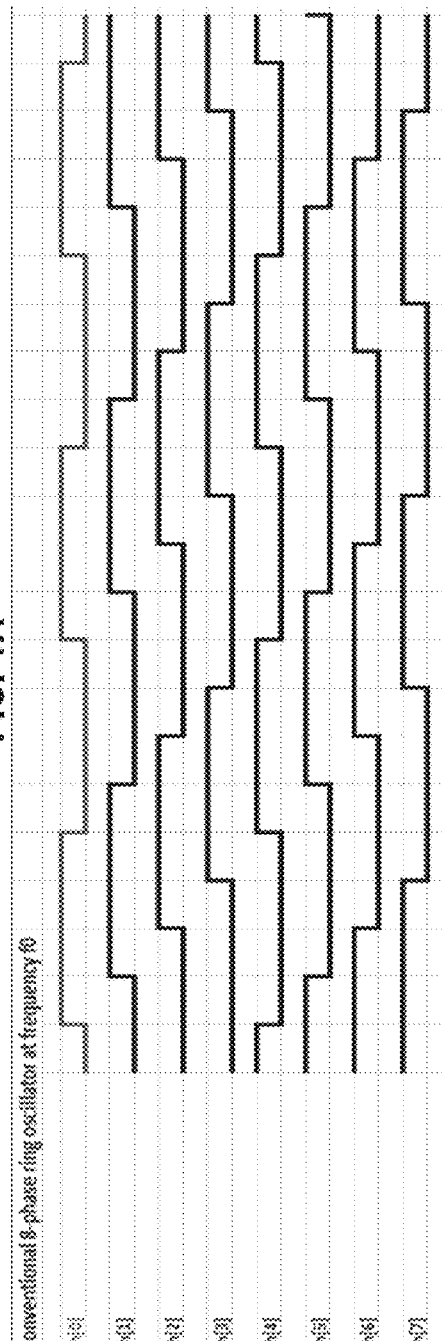

FIG. 1B is a waveform diagram of eight phase signals generated by the conventional ring oscillator of FIG. 1A.

Figure 2:
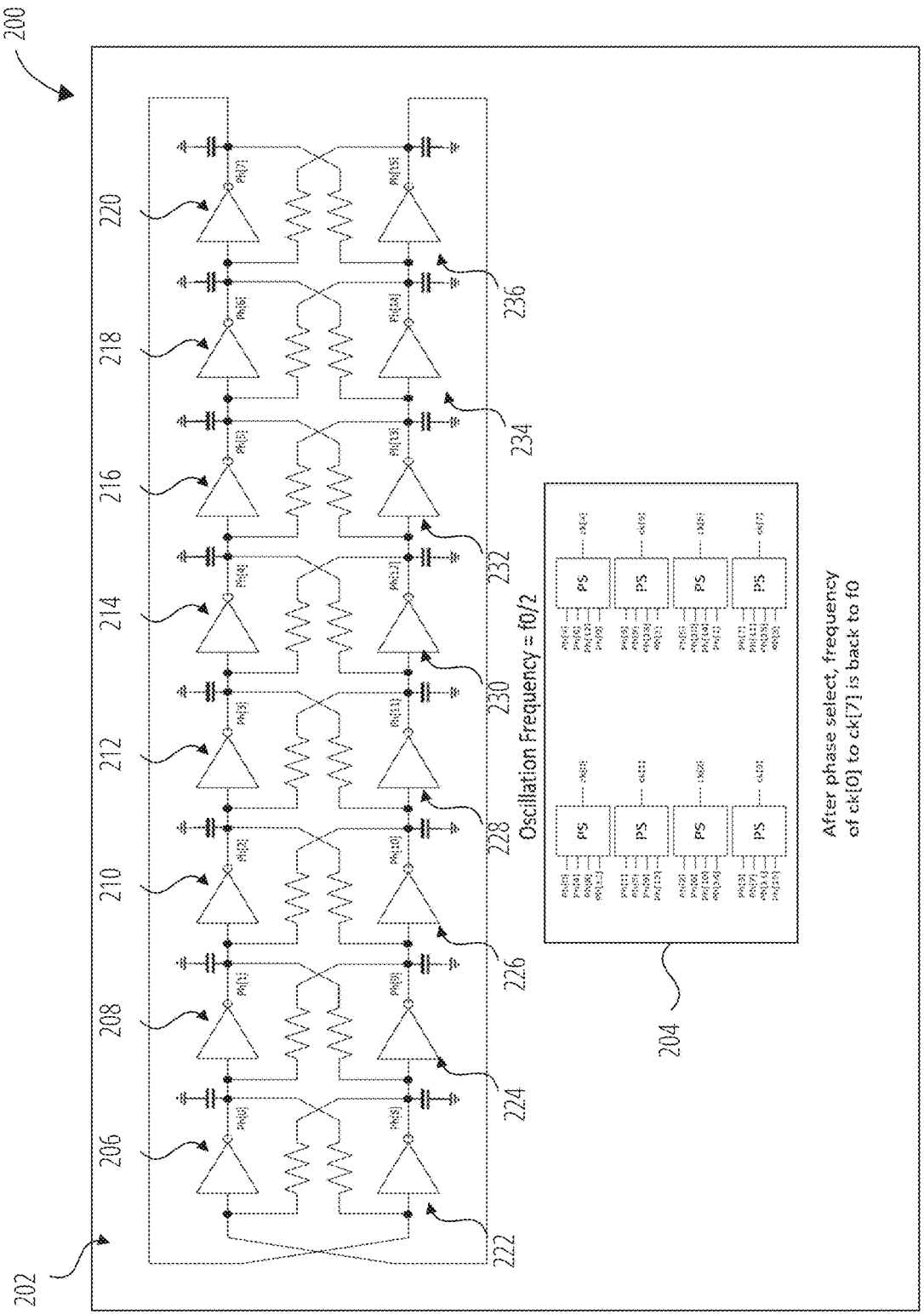

FIG. 2 is a schematic diagram of a ring oscillator circuit with a ring oscillator and a phase selector circuit, according to at least one embodiment.

Figure 3:
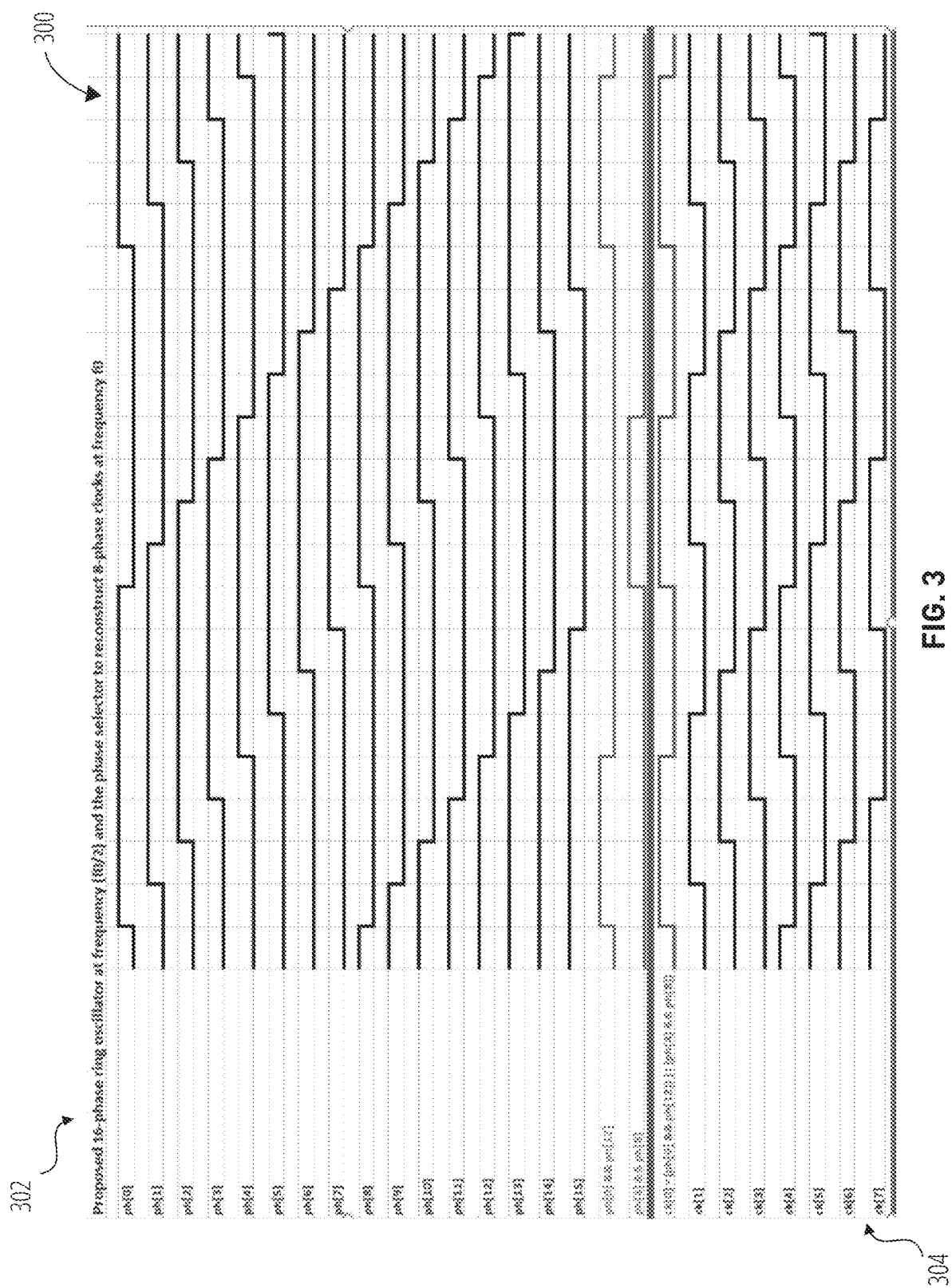

FIG. 3 is a waveform diagram of sixteen phase signals generated by the ring oscillator of FIG. 2 and eight phase clocks generated by the phase selector circuit of FIG. 2, according to at least one embodiment.

Figure 4:
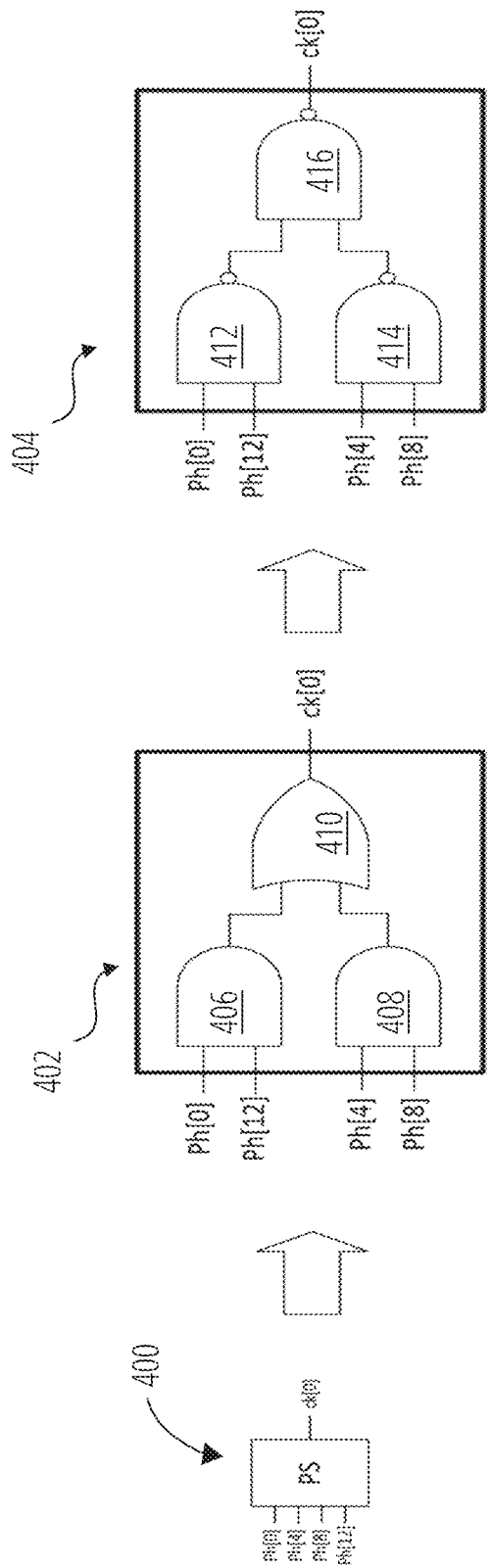

FIG. 4 illustrates a single 4-to-1 phase selector of phase selector circuit of FIG. 2 according to various embodiments.

Figure 5:
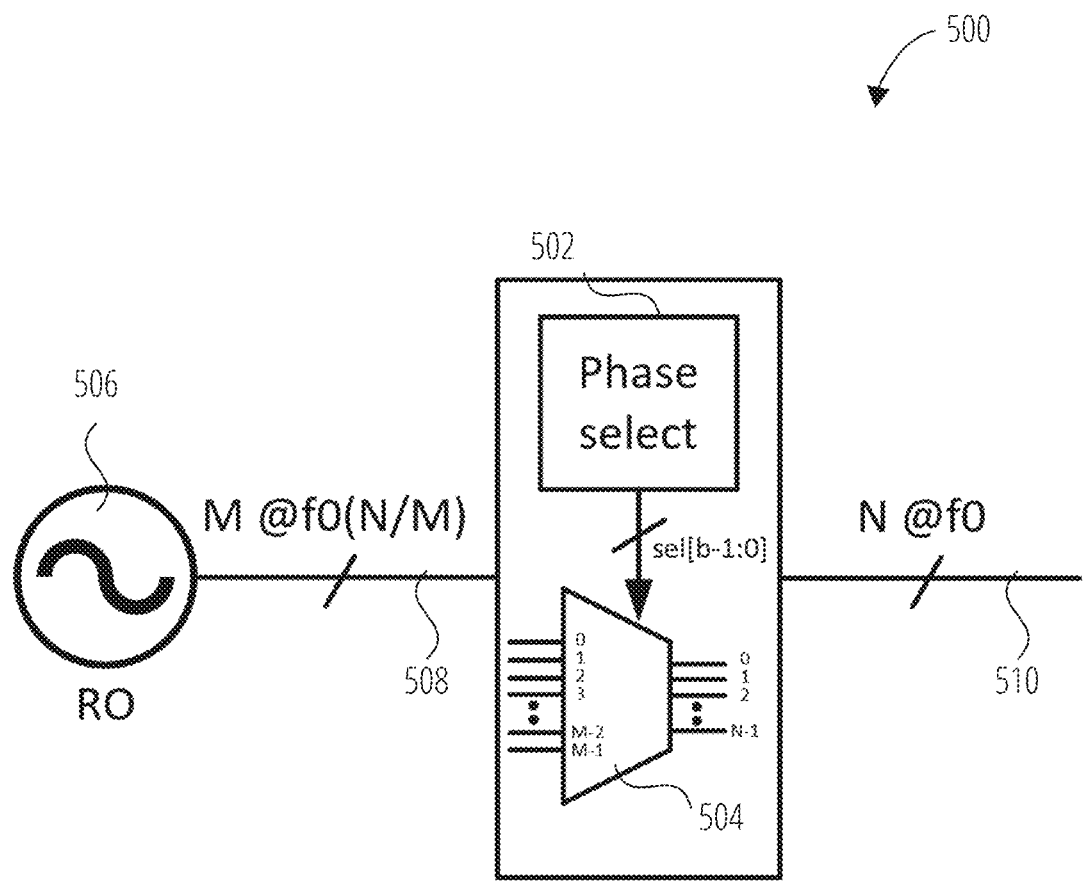

FIG. 5 illustrates a block diagram of a phase selector circuit with a sequential logic and an M-to-N multiplexer according to at least one embodiment.

Figure 6:
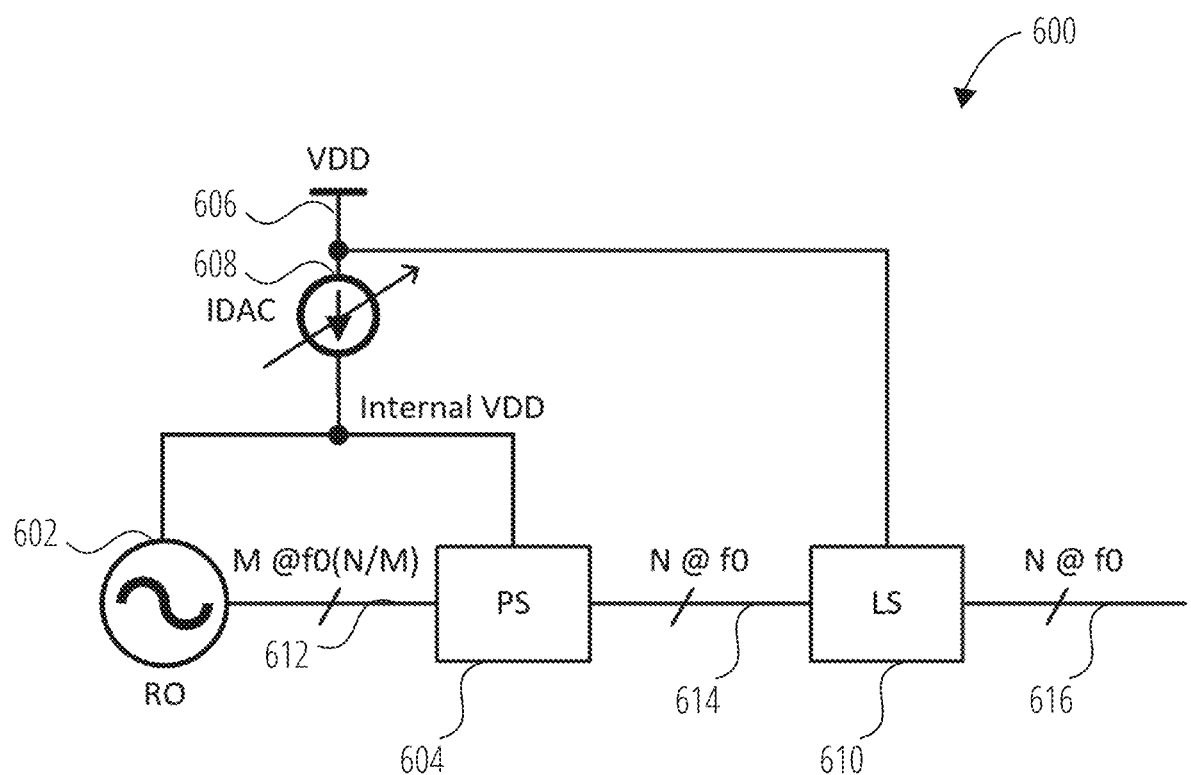

FIG. 6 is a block diagram of a ring oscillator circuit according to at least one embodiment.

Figure 7:
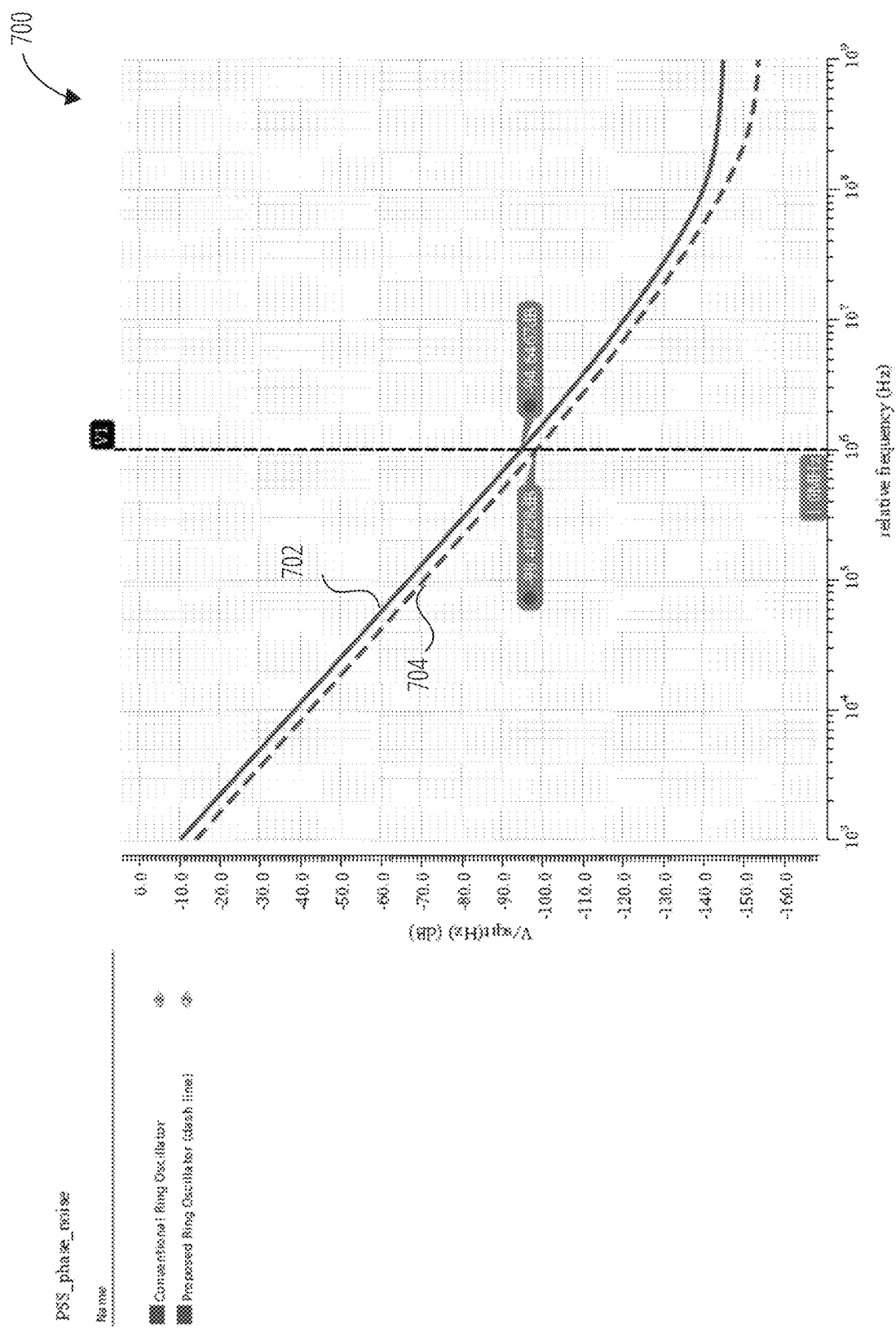

FIG. 7 is a graph illustrating a comparison of phase noise of a conventional ring oscillator and a phase noise of a ring oscillator circuit described herein, according to at least one embodiment.

Figure 8:
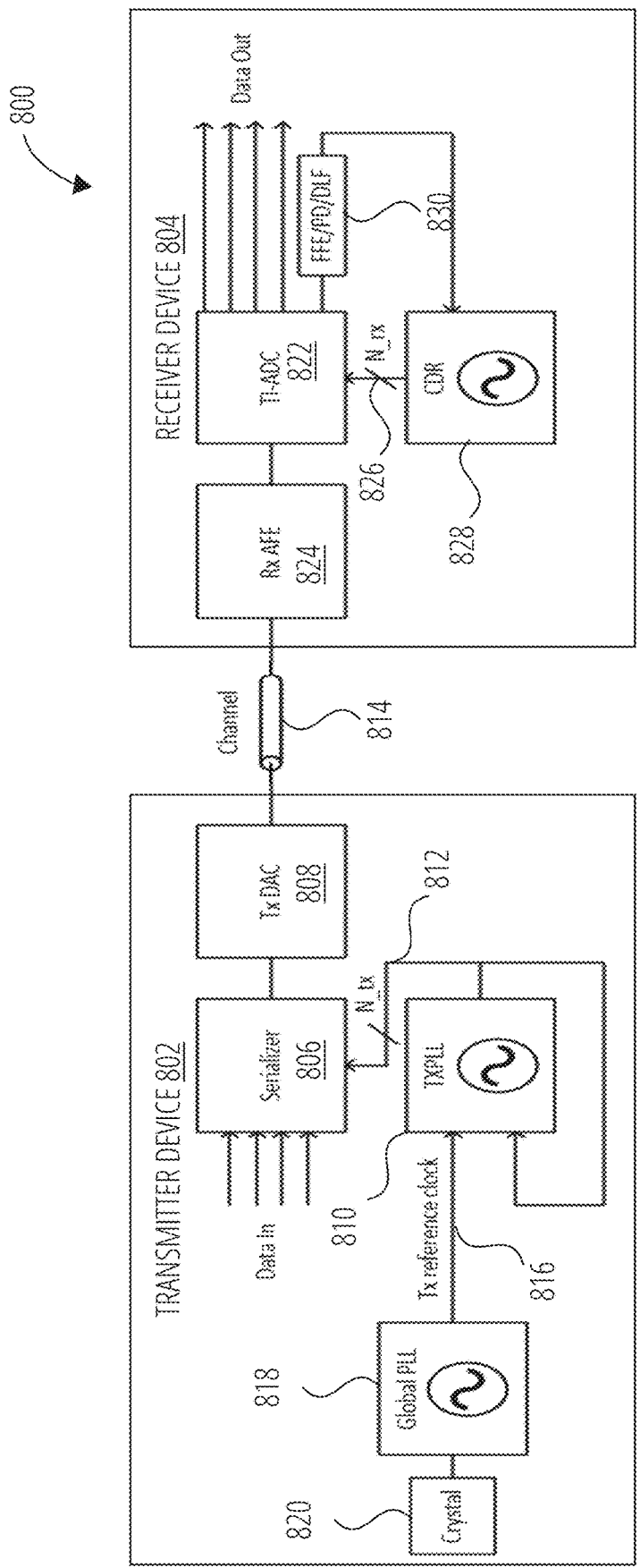

FIG. 8 is a block diagram of a SERDES system with a transmitter device and a receiver device, according to at least one embodiment.

Figure 9A:
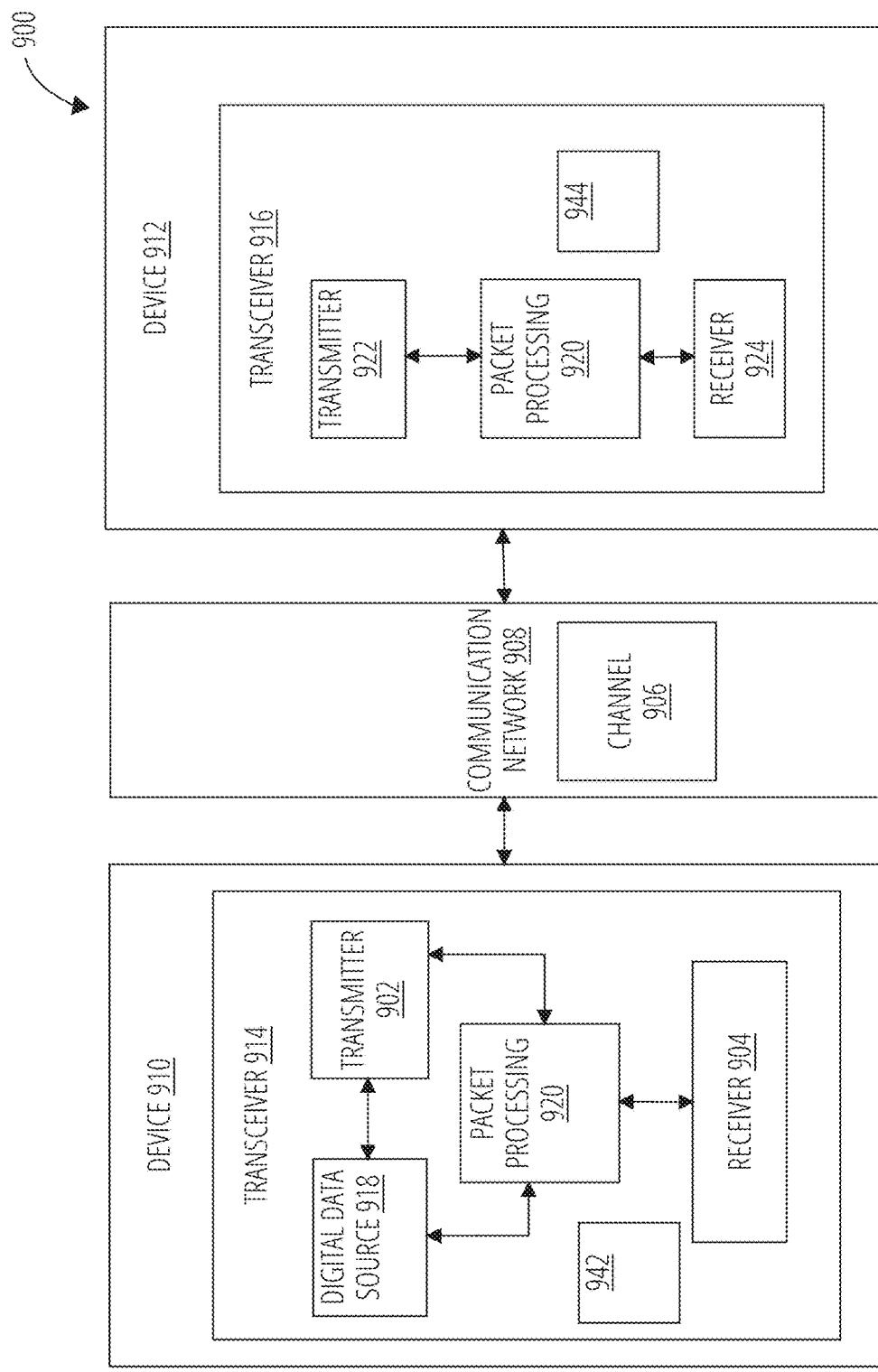

FIG. 9A illustrates an example communication system with a ring oscillator circuit with phase selection, in accordance with at least some embodiments.

Figure 9B:
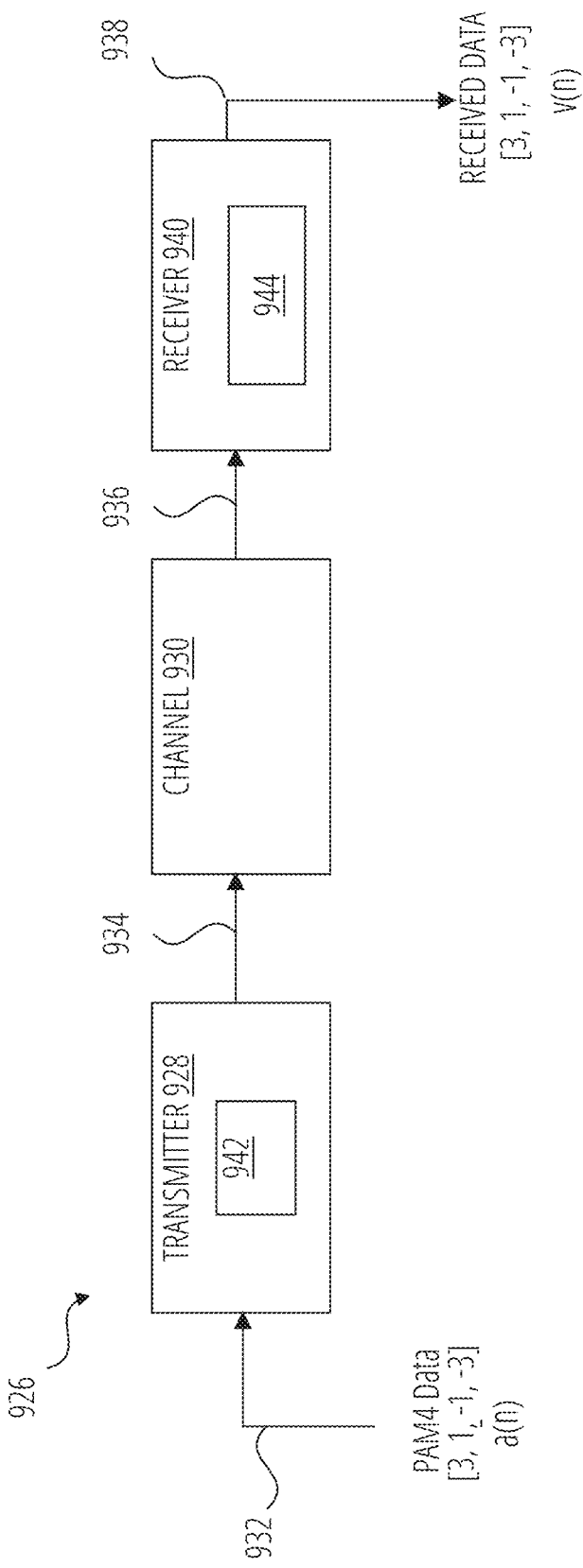

FIG. 9B is a block diagram of a communication system employing a ring oscillator circuit with phase selection in a transmitter, a receiver, or both according to at least one embodiment.

Figure 10:
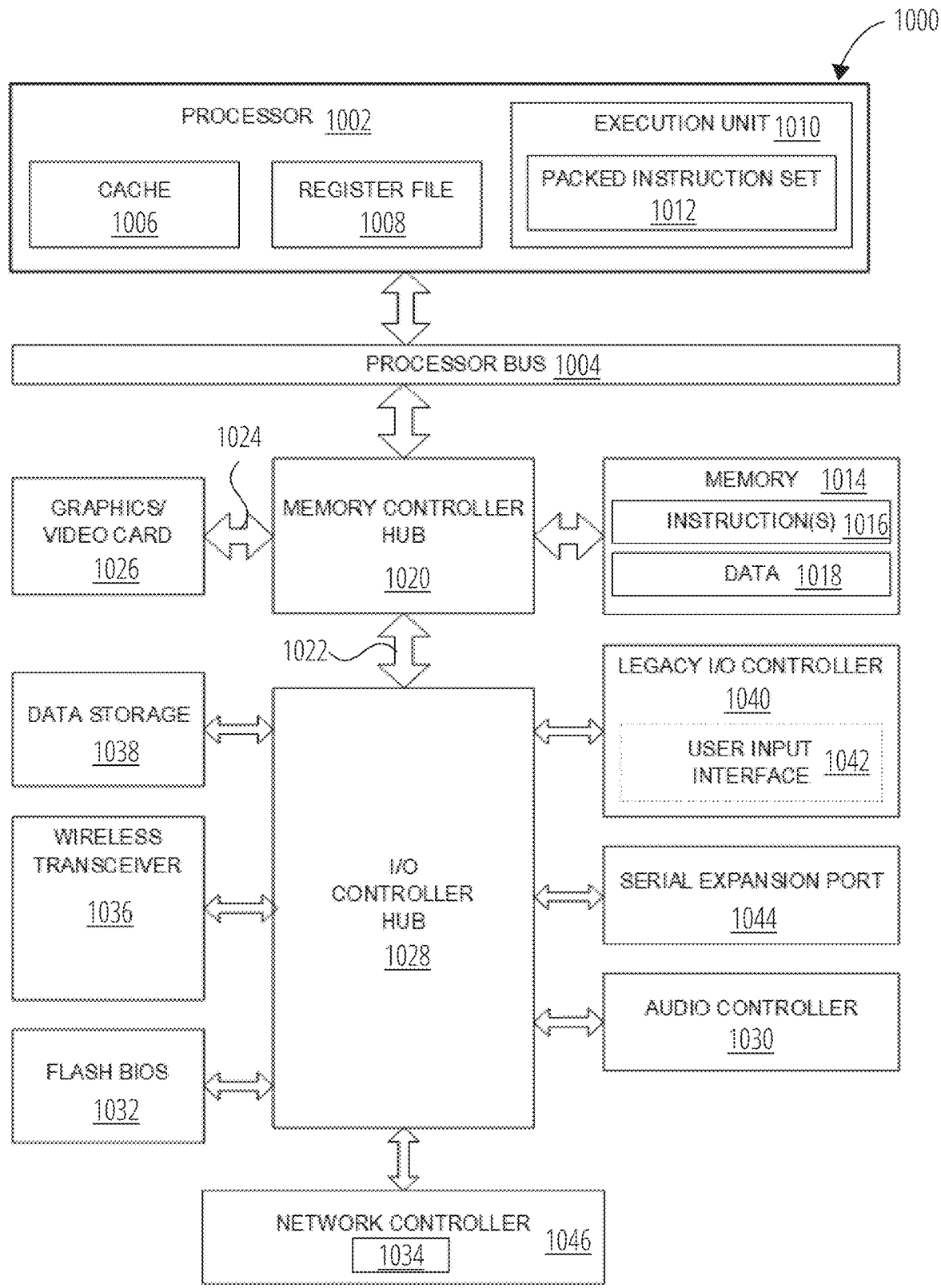

FIG. 10 illustrates an example computer system, including a network controller with a ring oscillator circuit with phase selection, in accordance with at least some embodiments.

Figure 11:
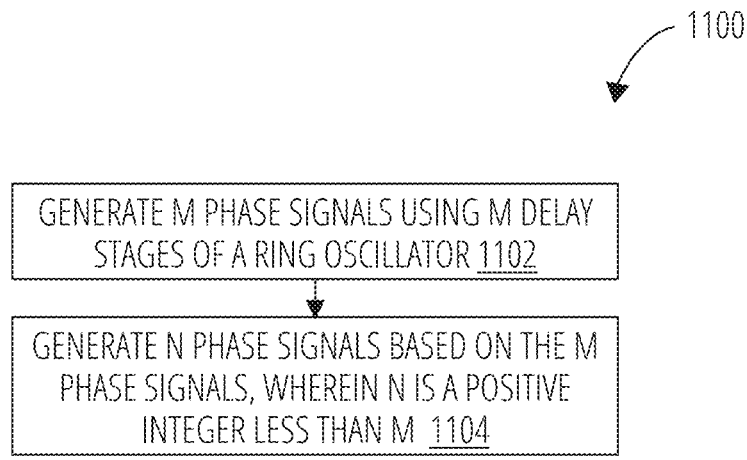

FIG. 11 is a flow diagram of a method for reducing phase noise in a ring oscillator according to at least one embodiment.

DETAILED DESCRIPTION

Technologies for low jitter and low power ring oscillators with multi-phase signal reassembly are described. As described above, low jitter, low power, and multi-phase clock generation are important factors in high-speed SERDES systems. Ring oscillators have become popular for high-speed circuits as they provide advantages, such as small area, multiple phases, wide frequency tuning range, and less coupling to surrounding circuits. Ring oscillators have jitter or phase noise. The phase noise is contributed by semiconductor devices' white noise and flicker noise. The flicker noise becomes more dominant as the size of the transistors is reduced in advanced processes. The ring oscillator's power and the number of stages can be increased to reduce the flicker noise. However, the number of stages is conventionally decided by a number of clock phases, N, needed in various circuits, such as an N-to-1 serializer in a transmitter or a time-interleaved analog-to-digital converter (TI-ADC) or decision feedback equalizer (DFE) in a receiver, not a direct result of optimal phase noise. Also, an oscillation frequency (f0) of the ring oscillator is usually set to a data rate (DR) divided by N (i.e., f0=DR/N).

Aspects and embodiments of the present disclosure address these and other challenges by providing a ring oscillator with an increased number of stages with multi-phase signal reassembly to reduce the phase noise induced by the flicker noise. Aspects and embodiments of the present disclosure can provide an intrinsically low jitter and low power ring oscillator that generates multi-phase signals (also referred to as phase clocks). Aspects and embodiments of the present disclosure can reduce the flicker noise by increasing the ring oscillator's number of stages (M stages) but only taking N phase signals out of the M phase signals. For example, if M=2N, only the even or odd phase signals can be used. This means the delay of each stage should be halved to keep the total delay around the ring oscillator the same (e.g., equivalent to keeping the oscillator running at f0). Eventually, this scheme is limited by the minimal delay of a delay stage a technology node can provide. Aspects and embodiments of the present disclosure provide a way to decouple oscillation frequency (f0), the number of required phase signals, N, and the number of stages, M. The proposed ring oscillator provides much better phase noise, consumes less power, and does not require the delay stage to run faster or at a higher oscillation frequency, so the technology does not limit it. For example, the proposed technology can be used to build an eight-phase 4 GHz ring oscillator for a clock and data recovery (CDR) circuit in a receiver with the phase selection scheme that improves the phase noise while consuming less power. For example, conventional solutions need to double the power at a 1 MHz offset frequency to improve the phase noise by around 3 dB. Aspects and embodiments of the present disclosure can improve the phase noise at 1 MHz offset frequency by 4.5 dB while consuming 4.4 mA less current than conventional solutions. Aspects and embodiments of the present disclosure can provide significant performance increases compared to the conventional ring oscillators, where the phase noise can only be improved by 3 dB when the power is doubled. Aspects and embodiments of the proposed ring oscillators, compared to other methods that use VCO, injection locking, and phase cleaning, can be smaller in area, have reduced crosstalk, and have increased phase signals while having intrinsically lower jitter and power.

Aspects and embodiments of the proposed ring oscillators can reassemble or reconstruct a required number of phase signals (also referred to as phase clocks) using a phase selection and multiplexer scheme described herein. More stages can be added to the ring oscillator with a lower oscillation frequency to improve the phase noise induced by the flicker noise of the devices. The relationship between phase noise and the number of stages is inversely proportional. As described herein, the delay of each stage remains the same, so as the number of stages increases, the oscillation frequency decreases proportionally. Even though the oscillation frequency is affected, there is no loss of information since there are more phases in the increased stages to retain the necessary rising and falling edges. A phase selector (PS) circuit or multiplexer scheme can be used to reassemble the rising and falling edges with the right sequence to reconstruct the final phase clocks, which have the same waveforms and frequency generated by conventional ring oscillators. The PS circuit can be implemented using logic gates, sequential logic, or the like. By keeping enough rising and falling edges with the desired delay between them, the true oscillation frequency is not important, allowing more stages to be added to the ring oscillator with a lower oscillation frequency to improve the phase noise.

Aspects and embodiments of the present disclosure can be implemented in a SERDES system in which the proposed ring oscillators are used to provide multiple phase signals to various blocks, such as a global phase-locked loop (PLL), a transmitter PLL, or a serializer in a transmitter, or a CDR circuit, TI-ADC, or DFE in a receiver, or the like. For example, a transmitter PLL provides N phase signals to an N-to-1 serializer to serialize data before sending the serialized data to another device across a channel. The CDR circuit can provide N phase signals to a TI-ADC or a DFE. Low jitter and multi-phase clock generation are important factors in high-speed SERDES systems.

FIG. 1A is a schematic diagram of a conventional ring oscillator 100 according to one implementation. The conventional ring oscillator 100 has eight delay stages 102-116. The eight delay stages 102-116 generate eight phase signals (Ph[0]-Ph[7]). Each delay stage has a feedforward resistor. The feedforward resistors suppress the common mode to ensure the proper oscillation. The conventional ring oscillator 100 has an oscillation frequency f0. Thus, the phase spacing between adjacent phase signals is expressed as $(1/8)*(1/f0)$, as illustrated in FIG. 1B.

FIG. 1B is a waveform diagram of eight phase signals 118 generated by the conventional ring oscillator of FIG. 1A. The eight phase signals 118 are equally spaced from one another by $(1/8)*(1/f0)$.

The conventional ring oscillator 100 and phase signals 118 of FIG. 1A and FIG. 1B are illustrated and described for comparison to a ring oscillator circuit 200 of FIG. 2 with a ring oscillator 202 with sixteen delay stages and a phase selector circuit 204 that generates eight phase signals that are the same as the eight phase signals 118 of FIG. 1B, according to the embodiments described herein.

FIG. 2 is a schematic diagram of a ring oscillator circuit 200 with a ring oscillator 202 and a phase selector circuit 204, according to at least one embodiment. The ring oscillator 202 has sixteen delay stages 206-236 that generate sixteen phase signals (Ph[0]-Ph[15]). Each delay stage has a feedforward resistor. The feedforward resistors suppress the common mode to ensure the proper oscillation. Since there are twice as many delay stages as the conventional ring oscillator 100, the ring oscillator 202 has a lower oscillation frequency, f0/2. Thus, the phase spacing between adjacent phase signals is expressed as $(1/16)*(2/f0)$, which is equal to the phase spacing of $(1/8)*(1/f0)$ of the conventional ring oscillator 100. The ring oscillator 202 is coupled to phase selector circuit 204 that receives the sixteen phase signals (Ph[0]-Ph[15]) 302 and generates eight phase clocks 304 ((ck[0]-ck[7]), as illustrated in FIG. 3. The phase selector circuit 204 can reassemble the rising and falling edges from multiple phase signals and reconstruct the final eight phase clocks 304 ((ck[0]-ck[7]). The eight phase clocks 304 ((ck[0]-ck[7]) of FIG. 3 are the equivalent to the eight phase signals 118 of FIG. 1B. After the phase selector circuit 204, the frequency of the eighth phase clock 304 is back to the higher oscillation frequency, f0.

In at least one embodiment, the ring oscillator circuit 200 includes a ring oscillator with a set of M delay stages, each stage outputting a phase signal, where M is a positive integer greater than one. The ring oscillator circuit 200 can include a phase selector circuit that can receive M phase signals from the ring oscillator and generate N phase signals based on the M phase signals, where N is a positive integer less than M. As illustrated in FIG. 2, the ring oscillator 202 is a M-phase ring oscillator at a lower oscillation frequency f0/2, where M is sixteen. The phase selector circuit can generate the same N-phase clock at a higher frequency of f0 as the conventional ring oscillator 100, where N is eight.

In at least one embodiment, the phase selector circuit 204 includes eight 4-to-1 phase selectors to reconstruct the final eight phase clocks 304 ((ck[0]-ck[7]) from the sixteen phase signals 302 (ph[0]-ph[15]), such as illustrated and described in more detail below with respect to FIG. 4. Alternatively, the phase selector circuit 204 can include other circuitry to reconstruct N phase signals from M phase signals from M delay stages of a ring oscillator.

FIG. 3 is a waveform diagram of sixteen phase signals generated by the ring oscillator 202 of FIG. 2 and eight phase clocks generated by the phase selector circuit 204 of FIG. 2, according to at least one embodiment. As described above, the ring oscillator 202 generates sixteen phase signals 302 (Ph[0]-Ph[15]). The phase selector circuit 204 receives the sixteen phase signals 302 (Ph[0]-Ph[15]) and reconstructs the final eight phase clock 304 (ck[0]-ck[7]). The eight phase clocks 304 ((ck[0]-ck[7]) of FIG. 3 are the equivalent to the eight phase signals 118 of FIG. 1B.

FIG. 4 illustrates a single 4-to-1 phase selector 400 of phase selector circuit 204 of FIG. 2 according to various embodiments. The 4-to-1 phase selector 400 can be implemented using various logic gates, as illustrated in a first phase selector circuit 402 and a second phase selector circuit 404 described in more detail below.

As described above, the ring oscillator 202 generates M phase signals (e.g., 16 phase signals), and the phase selector circuit 204 can reassemble rising edges of the M phase signals to generate the N phase signals (eight phase clocks 304). In another embodiment, the phase selector circuit 204 can reassemble falling edges of the M phase signals to generate the N phase signals (eight phase clock 304). In another embodiment, the phase selector circuit 204 can reassemble rising edges and falling edges of the M phase signals to generate the N phase signals (eight phase clock 304). In at least one embodiment, the ring oscillator 202 includes a first oscillation frequency less than a second frequency of the N phase signals. In at least one embodiment, M is equal to 2N, where the first oscillation frequency is equal to the second frequency divided by 2. In other embodiments, other values can be used for M and N.

In at least one embodiment, the phase selector circuit 204 includes a first logic gate to receive two or more of the M phase signals and to output a first intermediate signal, a second logic gate to receive two or more of the M phase signals and to output a second intermediate signal, and a third logic gate to receive the first intermediate signal and the second intermediate signal and to output one of the N phase signals. In at least one embodiment, the phase selector circuit 204 is the 4-to-1 phase selector 400.

In at least one embodiment, the 4-to-1 phase selector 400 is a first phase selector circuit 402 with a first AND gate 406, a second AND gate 408, and an OR gate 410. The first AND gate 406 receives a first phase signal (Ph[0]) and a thirteenth phase signal (Ph[12]) and combines these signals to generate a first intermediate signal. The second AND gate 408 receives a fifth phase signal (Ph[4]) and a ninth phase signal (Ph[8]) and combines these signals to generate a second intermediate signal. The OR gate 410 receives the first and second intermediate signals and generates a first clock phase (ck[0]). The phase selector circuit 204 can include additional similar phase selector circuits that receive the other twelve phase signals and similarly generate the remaining seven phase clocks.

In at least one embodiment, the 4-to-1 phase selector 400 is a second phase selector circuit 404 with three NAND gates 412, 414, 416. The first NAND gate 412 receives a first phase signal (Ph[0]) and a thirteenth phase signal (Ph[12]) and combines these signals to generate a first intermediate signal. The second NAND gate 414 receives a fifth phase signal (Ph[4]) and a ninth phase signal (Ph[8]) and combines these signals to generate a second intermediate signal. The third NAND gate 416 receives the first and second intermediate signals and generates a first clock phase (ck[0]). The phase selector circuit 204 can include additional similar phase selector circuits that receive the other twelve phase signals and similarly generate the remaining seven phase clocks.

In another embodiment, the phase selector circuit 204 includes sequential logic and an M-to-N multiplexer coupled to the sequential logic to generate N phase signals based on M phase signals, where M is greater than N, as illustrated in FIG. 5.

FIG. 5 illustrates a block diagram of a phase selector circuit 500 with a sequential logic 502 and an M-to-N multiplexer 504 according to at least one embodiment. The phase selector circuit 500 is coupled to a ring oscillator 506 that generates M phase signals 508. The M-to-N multiplexer 504 receives the M phase signals 508 from the ring oscillator 506. The ring oscillator 506 has an oscillating frequency of f0 (N/M). The sequential logic 502 can control the M-to-N multiplexer 504 to select N phase signals 510 from the M phase signals 508 at a time, the N phase signals 510 having a second frequency of f0. The sequential logic 502 can control the M-to-N multiplexer 504 by using one or more control signals. In at least one embodiment, the sequential logic 502 is a shift register that rotates selections by the M-to-N multiplexer. In at least one embodiment, the sequential logic 502 can send phase-select signals (e.g., sel[b-1:0]) to the M-to-N multiplexer 504 to select N outputs from the M inputs at a time. In this embodiment, the inputs of the M-to-N multiplexer 504 are the M phase signals 508 from the ring oscillator 506 that oscillates at a first oscillation frequency, and the N outputs are the N phase signals 510 that have a second frequency, where the first oscillation frequency is less than the second frequency. That is, there can be a frequency domain cross where M inputs are at a first frequency (e.g., f0 (N/M).), and, after phase selection and reassembly, the N outputs are at a second frequency (f0). The N phase signals 510 can be used for various blocks, such as an N-to-1 serializer in a transmitter, a TI-ADC in a receiver, or a DFE in a receiver.

FIG. 6 is a block diagram of a ring oscillator circuit 600 according to at least one embodiment. The ring oscillator circuit 600 includes a ring oscillator 602, a phase selector circuit 604, a current digital-to-analog converter (IDAC) 608, and level shifters 610. The ring oscillator 602 can generate M phase signals 612. The phase selector circuit 604 receives the M phase signals 612 from the ring oscillator 506, and the phase selector circuit 604 generates N phase signals 614.

Generally, the phase selector circuit 604 can take M input phases, make the phase selection internally, and generate N output phases. As described above, the implementation of the phase selector circuit 604 can be combinational logic, sequential logic, or the like.

The IDAC 608 is coupled to a first voltage supply 606. The IDAC 608 can provide a second voltage supply to the ring oscillator 602 and the phase selector circuit 604. The second voltage supply is lower than the first voltage supply. In this embodiment, the phase selector circuit 604 and the ring oscillator 602 share the same internal voltage supply (e.g., VDD) provided by the IDAC 608. In at least one embodiment, the ring oscillator 602 generates less jitter when used in a current mode rather than a voltage mode. Therefore, a p-channel metal-oxide-semiconductor (PMOS) current source, such as IDAC 608, can provide current to the ring oscillator 602, and the swing at the ring oscillator outputs is lower than a supply voltage. To recover it to full swing, each output should be followed by a level shifter. The level shifters 610 can be a set of N level shifters coupled to the phase selector circuit 604 and the first voltage supply 606. The set of N level shifters can shift voltage levels of the N phase signals 614 from a second level to a first level greater than the second level. That is, the level shifters 610 output N phase signals 616 with a second voltage level. The second voltage level can correspond to the expected level of the circuitry using the N phase signals 616. In at least one embodiment, the level shifters can include an alternating current (AC) capacitor, an inverter, and a feedback resistor. The level shifter can consume power, and the AC capacitor occupies a silicon area, so the number of level shifters should be minimized. The phase selector circuit 604 and the ring oscillator 602 can be supplied by the same PMOS current source, sharing the same internal voltage domain. The phase selector circuit 604 can reduce the number of phases from M to N before sending them to the level shifters 610. Compared to the conventional ring oscillator 100, the number of level shifters 610 is the same.

FIG. 7 is a graph 700 illustrating a comparison of phase noise 702 of a conventional ring oscillator and phase noise 704 of a ring oscillator circuit described herein, according to at least one embodiment. The conventional ring oscillator (RO) is coupled to a level shifter (LS). The phase noise 702 of this circuit is approximately −94.65 dBc/Hz at a 1 MHz offset frequency. The total current to the conventional ring oscillator is approximately 20 mA. The first oscillation frequency of the conventional RO is 4 GHz.

The ring oscillator circuit includes a ring oscillator (RO) that generates M phase signals, a phase selector (PS) that selects N phase signals from the M phase signals, and a level shifter (LS) coupled to the phase selector. The phase noise 704 of the ring oscillator circuit is approximately −98.41 dBc/Hz at a 1 MHz offset frequency. The total current to the ring oscillator and the phase selector circuit is approximately 15.6 mA. The second oscillation frequency of the RO is 2 GHz, and the PS output is at 4 GHz. As illustrated in FIG. 7, the phase noise 704 at 1 MH is improved by 3.8 dB while consuming 4.4 mA less current than the conventional ring oscillator.

FIG. 8 is a block diagram of a SERDES system 800 with a transmitter device 802 and a receiver device 804, according to at least one embodiment. The transmitter device 802 can be a first SERDES integrated circuit (IC), and the receiver device 804 can be a second SERDES IC. The transmitter device 802 can convert parallel data to serial data. The receiver device 804 can convert serial data to parallel data. In other embodiments, the devices can convert data sent and received in the other direction. SERDES ICs can facilitate transmission between two devices over serial streams, reducing the number of data paths, wires/traces, terminals, etc.

In at least one embodiment, the transmitter device 802 includes a serializer 806. The serializer 806 can be an N-to-1 serializer that converts parallel data to serial data before input into a TX DAC 808. The TX DAC 808 converts the digital signal to an analog signal before being sent over the channel 814 to the receiver device 804. The transmitter device 802 also includes a TX PLL 810 coupled to the serializer 806. The TX PLL 810 can provide a first set of N phase signals 812 to the serializer 806. The TX PLL 810 includes a first ring oscillator with a first set of M delay stages, each stage outputting a phase signal, where M is a positive integer greater than one. The TX PLL 810 also includes a first phase selector circuit coupled to the first ring oscillator. The first phase selector circuit can receive a first set of M phase signals from the first ring oscillator. The first phase selector circuit can generate the first set of N phase signals 812 based on the first set of M phase signals, where N is a positive integer less than M. The TX PLL 810 can receive a transmitter reference clock 816 from a global PLL 818. The global PLL 818 can receive an oscillator signal from a crystal oscillator 820.

In at least one embodiment, the receiver device 804 includes a TI-ADC 822. The TI-ADC 822 receives an incoming signal from a receiver analog front-end (RX AFE) circuitry 824. The RX AFE circuitry 824 can receive serial data over the channel 814 from the transmitter device 802. The TI-ADC 822 can receive a second set of N phase signals 826 from a clock data recovery (CDR) circuit 828 coupled to the TI-ADC 822. The CDR circuit 828 includes a second ring oscillator with a second set of M delay stages, each stage outputting a phase signal. The CDR circuit 828 also includes a second phase selector circuit coupled to the second ring oscillator. The second phase selector circuit can receive a second set of M phase signals from the second ring oscillator. The second phase selector circuit can generate the second set of N phase signals 826 based on the second set of M phase signals. The CDR circuit 828 can provide the second set of N phase signals 826 to the TI-ADC 822. In at least one embodiment, the TI-ADC 822 can deserialize the serial data to parallel data based on the second set of N phase signals 826.

In a further embodiment, the receiver device 804 further includes a feed-forward equalizer (FFE), a phase detector (PD), and a digital loop filter (DLF) in a feedback loop with the CDR circuit 828. The FFE can be used to equalize the incoming signal to reconstruct the symbols. The phase detector (PD) can determine phase information about a transmit clock or a data signal. The CDR circuit 828 can use the phase information to control sampling clock(s) in a closed-loop fashion. The CDR circuit 828 can use the phase information to adjust sampling for subsequent data in an incoming data signal. The CDR circuit 828 can be coupled to additional equalization blocks or symbol detectors.

In at least one embodiment, the CDR circuit 828 includes a feedback loop with the FFE, PD, and DLF in a closed feedback loop. The TI-ADC 822 can generate data signal samples using the second set of N phase signals 826 as sampling clocks. The FFE can determine current data based on the samples and provide an equalized output. The PD can use the equalization output to determine the phase information. The phase detector can measure a phase offset corresponding to the current data. The DLF can filter the phase offset and control the CDR circuit 828 based on the filtered phase offset. The CDR circuit 828 can operate with a loop bandwidth at a first frequency (e.g., 4 MHz). The CDR circuit 828 can provide the second set of N phase signals 826 as sampling clocks based on an output of the DLF.

In at least one embodiment, the transmitter device 802 and the receiver device 804 can include additional ring oscillator circuits with phase selection for other blocks.

FIG. 9A illustrates an example communication system 900 with a ring oscillator circuit with phase selection, in accordance with at least some embodiments. The communication system 900 includes a device 910, a communication network 908 including a communication channel 906, and a device 912. In at least one embodiment, the devices 910 and 912 are integrated circuits of a Personal Computer (PC), a laptop, a tablet, a smartphone, a server, a collection of servers, or the like. In some embodiments, the devices 910 and 912 may correspond to any appropriate type of device that communicates with other devices also connected to a common type of communication network 908. According to embodiments, the transmitters 902 and 922 of devices 910 and 912 may correspond to transmitters of a graphics processing unit (GPU), a switch (e.g., a high-speed network switch), a network adapter, a central processing unit (CPU), a data processing unit (DPU), etc.

Examples of the communication network 908 that may be used to connect the devices 910 and 912 include wires, conductive traces, bumps, terminals, or the like. In one example, the communication network 908 is a network that enables data transmission between the devices 910 and 912 using data signals (e.g., digital, optical, wireless signals), clock signals, or both.

The device 910 includes a transceiver 914 for sending and receiving signals, for example, data signals. The data signals may be digital or optical signals modulated with data or other suitable signals for carrying data.

The transceiver 914 may include a digital data source 918, a transmitter 902, a receiver 904, and packet processing 920 that controls the transceiver 914. The transceiver 914 can include a ring oscillator circuit 942 with phase selection as described above with respect to FIG. 2 to FIG. 8. The digital data source 918 may include suitable hardware and/or software for outputting data in a digital format (e.g., in binary code and/or thermometer code). The digital data output by the digital data source 918 may be retrieved from memory (not illustrated) or generated according to input (e.g., user input).

The transceiver 914 includes suitable software and/or hardware for receiving digital data from the digital data source 918 and outputting data signals according to the digital data for transmission over the communication network 908 to a transceiver 916 of device 912.

The receiver 904 of device 910 may include suitable hardware and/or software for receiving signals, for example, data signals from the communication network 908. For example, the receiver 904 may include components for receiving processing signals to extract the data for storing in a memory. In at least one embodiment, the transceiver 916 includes a transmitter 922 and receiver 924. The transceiver 916 can include a ring oscillator circuit 944 with phase selection as described above with respect to FIG. 2 to FIG. 8. The transceiver 916 receives an incoming signal and samples the incoming signal to generate samples, such as using an analog-to-digital converter (ADC). The ADC can be controlled by a clock-recovery circuit (or clock recovery block) in a closed-loop tracking scheme. The clock-recovery circuit can include a controlled oscillator, such as a voltage-controlled oscillator (VCO) or a digitally-controlled oscillator (DCO) that controls the sampling of the subsequent data by the ADC.

The packet processing 920 may comprise software, hardware, or a combination thereof. For example, the packet processing 920 may include a memory including executable instructions and a processor (e.g., a microprocessor) that executes the instructions on the memory. The memory may correspond to any suitable type of memory device or collection of memory devices configured to store instructions. Non-limiting examples of suitable memory devices may include Flash memory, Random Access Memory (RAM), Read Only Memory (ROM), variants thereof, combinations thereof, or the like. In some embodiments, the memory and processor may be integrated into a common device (e.g., a microprocessor may include integrated memory). Additionally or alternatively, the packet processing 920 may comprise hardware, such as an ASIC. Other non-limiting examples of the packet processing 920 include an Integrated Circuit (IC) chip, a CPU, a GPU, a DPU, a microprocessor, a Field Programmable Gate Array (FPGA), a collection of logic gates, transistors, resistors, capacitors, inductors, diodes, or the like. Some or all of the packet processing 920 may be provided on a Printed Circuit Board (PCB) or collection of PCBs. It should be appreciated that any appropriate type of electrical component or collection of electrical components may be suitable for inclusion in the packet processing 920. The packet processing 920 may send and/or receive signals to and/or from other elements of the transceiver 914 to control the overall operation of the transceiver 914.

The transceiver 914 or selected elements of the transceiver 914 may take the form of a pluggable card or controller for the device 910. For example, the transceiver 914 or selected elements of the transceiver 914 may be implemented on a network interface card (NIC).

The device 912 may include a transceiver 916 for sending and receiving signals, for example, data signals over a channel 906 of the communication network 908. The same or similar structure of transceiver 914 may be applied to transceiver 916; thus, the structure of transceiver 916 is not described separately.

Although not explicitly shown, it should be appreciated that devices 910 and 912 and the transceiver 914 and transceiver 916 may include other processing devices, storage devices, and/or communication interfaces generally associated with computing tasks such as sending and receiving data.

FIG. 9B is a block diagram of a communication system 926 employing a ring oscillator circuit with phase selection in a transmitter 928, a receiver 940, or both, according to at least one embodiment. In the example shown in FIG. 9B, a Pulse Amplitude Modulation level-4 (PAM4) modulation scheme is employed with respect to the transmission of a signal (e.g., digitally encoded data) from a transmitter (TX) 928 to a receiver (RX) 940 via a communication channel 930 (e.g., a transmission medium). In one embodiment, the transmitter 928 has the ring oscillator circuit 942. In another embodiment, the receiver 940 includes the ring oscillator circuit 944. In another embodiment, the transmitter 928 includes the ring oscillator circuit 942, and the receiver 940 includes the ring oscillator circuit 944. The ring oscillator circuit 942 and ring oscillator circuit 944 are similar to the ring oscillator circuits described above with respect to FIG. 2 to FIG. 8.

In this example, the transmitter 928 receives an input data 932 (i.e., the input data at time n is represented as "a(n)"), which is modulated in accordance with a modulation scheme (e.g., pulse amplitude modulation four level (PAM4)) and sends the signal 934 a(n) including a set of data symbols (e.g., symbols −3, −1, 1, 3, where the symbols represent coded binary data). It is noted that while the use of the PAM4 modulation scheme is described herein by way of example, other data modulation schemes can be used in accordance with embodiments of the present disclosure, including for example, a non-return-to-zero (NRZ) modulation scheme, PAM7, PAM8, PAM16, etc. For example, for an NRZ-based system, the transmitted data symbols consist of symbols −1 and 1, with each symbol value representing a binary bit. This is also known as a PAM level-2 or PAM2 system as there are 2 unique values of transmitted symbols. Typically, a binary bit 0 is encoded as −1, and a bit 1 is encoded as 1 as the PAM2 values.

In the example shown, the PAM4 modulation scheme uses four (4) unique values of transmitted symbols to achieve higher efficiency and performance. The four levels are denoted by symbol values −3, −1, 1, 3, with each symbol representing a corresponding unique combination of binary bits (e.g., 00, 01, 10, 11).

The communication channel 930 is a destructive medium in that the channel acts as a low pass filter that attenuates higher frequencies more than it attenuates lower frequencies, introduces inter-symbol interference (ISI) and noise from cross talk, power supplies, Electromagnetic Interference (EMI), or other sources. The communication channel 930 can be over serial links (e.g., a cable, PCB traces, copper cables, optical fibers, or the like), read channels for data storage (e.g., hard disk, flash solid-state drives (SSDs), high-speed serial links, deep space satellite communication channels, applications, or the like. The receiver (RX) 940 receives an incoming signal 936 over the channel 930. As described above, the receiver 940 can include the ring oscillator circuit 944 with phase selection. The receiver 940 can output a received signal 938, "v(n)," including the set of data symbols (e.g., symbols −3, −1, 1, 3, where the symbols represent coded binary data).

In at least one embodiment, the transmitter 928 can be part of a SERDES IC. The SERDES IC can be a transceiver that converts parallel data to serial data and vice versa. The SERDES IC can facilitate transmission between two devices over serial streams, reducing the number of data paths, wires/traces, terminals, etc. The receiver 940 can be part of a SERDES IC. The SERDES IC can include a clock-recovery circuit. The clock-recovery circuit can be coupled to an ADC and an equalization block.

FIG. 10 illustrates an example computer system 1000, including a network controller 1046 with a ring oscillator circuit 1034 with phase selection, in accordance with at least some embodiments. The ring oscillator 1034 with phase selection is used to receive packets of a single transport stream out of order as described herein. In at least one embodiment, computer system 1000 may be a system with interconnected devices and components, a System on Chip (SoC), or some combination. In at least one embodiment, computer system 1000 is formed with a processor 1002 that may include execution units to execute an instruction. In at least one embodiment, computer system 1000 may include, without limitation, a component, such as a processor 1002, to employ execution units including logic to perform algorithms for processing data. In at least one embodiment, computer system 1000 may include processors, such as PENTIUM® Processor family, Xeon™, Itanium®, XScale™ and/or StrongARM™, Intel® Core™, or Intel® Nervana™ microprocessors available from Intel Corporation of Santa Clara, California, although other systems (including PCs having other microprocessors, engineering workstations, set-top boxes and like) may also be used. In at least one embodiment, computer system 1000 may execute a version of WINDOWS' operating system available from Microsoft Corporation of Redmond, Wash., although other operating systems (UNIX and Linux, for example), embedded software, and/or graphical user interfaces, may also be used.

In at least one embodiment, computer system 1000 may be used in other devices such as handheld devices and embedded applications. Some examples of handheld devices include cellular phones, Internet Protocol devices, digital cameras, personal digital assistants ("PDAs"), and handheld PCs. In at least one embodiment, embedded applications may include a microcontroller, a digital signal processor (DSP), an SoC, network computers ("NetPCs"), set-top boxes, network hubs, wide area network ("WAN") switches, or any other system that may perform one or more instructions. In an embodiment, computer system 1000 may be used in devices such as graphics processing units (GPUs), network adapters, central processing units, and network devices such as switches (e.g., a high-speed direct GPU-to-GPU interconnect such as the NVIDIA GH100 NVLINK or the NVIDIA Quantum 2 64 Ports InfiniBand NDR Switch).

In at least one embodiment, computer system 1000 may include, without limitation, processor 1002 that may include, without limitation, one or more execution units 807 that may be configured to execute a Compute Unified Device Architecture ("CUDA") (CUDA® is developed by NVIDIA Corporation of Santa Clara, California) program. In at least one embodiment, a CUDA program is at least a portion of a software application written in a CUDA programming language. In at least one embodiment, computer system 1000 is a single processor desktop or server system. In at least one embodiment, computer system 1000 may be a multiprocessor system. In at least one embodiment, processor 1002 may include, without limitation, a complex instruction set computer (CISC) microprocessor, a reduced instruction set computer (RISC) microprocessor, a Very Long Instruction Word (VLIW) microprocessor, and a processor implementing a combination of instruction sets, or any other processor device, such as a digital signal processor, for example. In at least one embodiment, processor 1002 may be coupled to a processor bus 1004 that may transmit data signals between processor 1002 and other components in computer system 1000.

In at least one embodiment, processor 1002 may include, without limitation, a Level 1 ("L1") internal cache memory ("cache") 1006. In at least one embodiment, processor 1002 may have a single internal cache or multiple levels of internal cache. In at least one embodiment, cache memory may reside external to processor 1002. In at least one embodiment, processor 1002 may also include a combination of both internal and external caches. In at least one embodiment, a register file 1008 may store different types of data in various registers, including integer registers, floating point registers, status registers, instruction pointer registers, or the like.

In at least one embodiment, execution unit 1010, including, without limitation, logic to perform integer and floating point operations, also resides in processor 1002. Processor 1002 may also include a microcode ("ucode") read-only memory ("ROM") that stores microcode for certain macro instructions. In at least one embodiment, execution unit 1010 may include logic to handle a packed instruction set 1012. In at least one embodiment, by including packed instruction set 1012 in an instruction set of a general-purpose processor 1002, along with associated circuitry to execute instructions, operations used by many multimedia applications may be performed using packed data in a general-purpose processor 1002. In at least one embodiment, many multimedia applications may be accelerated and executed more efficiently by using the full width of a processor's data bus for performing operations on packed data, which may eliminate the need to transfer smaller units of data across a processor's data bus to perform one or more operations one data element at a time.

In at least one embodiment, execution unit 1010 may also be used in microcontrollers, embedded processors, graphics devices, DSPs, and other types of logic circuits. In at least one embodiment, computer system 1000 may include, without limitation, a memory 1014. In at least one embodiment, memory 1014 may be implemented as a Dynamic Random Access Memory (DRAM) device, a Static Random Access Memory (SRAM) device, a flash memory device, or other memory devices. Memory 1014 may store instruction(s) 1016 and/or data 1018 represented by data signals that may be executed by processor 1002.

In at least one embodiment, a system logic chip may be coupled to a processor bus 1004 and memory 1014. In at least one embodiment, the system logic chip may include, without limitation, a memory controller hub ("MCH") 1020, and processor 1002 may communicate with MCH 1020 via processor bus 1004. In at least one embodiment, MCH 1020 may provide a high bandwidth memory path to memory 1014 for instruction and data storage and storage of graphics commands, data, and textures. In at least one embodiment, MCH 1020 may direct data signals between processor 1002, memory 1014, and other components in computer system 1000 and may bridge data signals between processor bus 1004, memory 1014, and a system I/O 1022. In at least one embodiment, a system logic chip may provide a graphics port for coupling to a graphics controller. In at least one embodiment, MCH 1020 may be coupled to memory 1014 through high bandwidth memory path, and graphics/video card 1026 may be coupled to MCH 1020 through an Accelerated Graphics Port ("AGP") interconnect 1024.

In at least one embodiment, computer system 1000 may use system I/O 1022, a proprietary hub interface bus that couples MCH 1020 to I/O controller hub ("ICH") 1028. In at least one embodiment, ICH 1028 may provide direct connections to some I/O devices via a local I/O bus. In at least one embodiment, a local I/O bus may include, without limitation, a high-speed I/O bus for connecting peripherals to memory 1014, a chipset, and processor 1002. Examples may include, without limitation, an audio controller 1030, a firmware hub ("flash BIOS") 1032, a wireless transceiver 1036, a data storage 1038, a legacy I/O controller 1040 containing a user input interface 1042, a keyboard interface, a serial expansion port 1044, such as a USB port, and a network controller 1046, including the ring oscillator 1034 with phase selection as described herein. Data storage 1038 may comprise a hard disk drive, a floppy disk drive, a CD-ROM device, a flash memory device, or other mass storage devices.

In at least one embodiment, FIG. 10 illustrates a computer system 1000, which includes interconnected hardware devices or "chips." In at least one embodiment, FIG. 10 may illustrate an example SoC. In at least one embodiment, devices illustrated in FIG. 10 may be interconnected with proprietary interconnects, standardized interconnects (e.g., Peripheral Component Interconnect Express (PCIe), or some combination thereof. In at least one embodiment, one or more components of computer system 1000 are interconnected using compute express link ("CXL") interconnects.

FIG. 11 is a flow diagram of a method 1100 for reducing phase noise in a ring oscillator according to at least one embodiment. The method 1100 can be performed by processing logic comprising hardware, software, firmware, or any combination thereof. In at least one embodiment, the method 1100 is performed by ring oscillator circuit 200 of FIG. 2, ring oscillator 506 and phase selector circuit 500 of FIG. 5, or ring oscillator 602 and phase selector circuit 604 of FIG. 6. In at least one embodiment, the method 1100 is performed by the transmitter device 802 or the receiver device 804 of FIG. 8. In at least one embodiment, the method 1100 is performed by the transceiver 914 or transceiver 916 of FIG. 9A. In at least one embodiment, the method 1100 is performed by the transmitter 928 or the receiver 940 of FIG. 9B. In yet another embodiment, the method 1100 is performed by ring oscillator circuit 1034 of FIG. 10.

Referring to FIG. 11, the method 1100 begins with the processing logic generating M phase signals using M delay stages of a ring oscillator (block 1102). The processing logic generates N phase signals based on the M phase signals, where N is a positive integer less than M (block 1104).

In a further embodiment, the N phase signals are generated at block 1104 by reassembling the rising edges of the M phase signals. In another embodiment, the N phase signals are generated by reassembling the falling edges of the M phase signals. In another embodiment, the N phase signals are generated by reassembling the rising edges and the falling edges of the M phase signals.

In at least one embodiment, the ring oscillator includes a first oscillation frequency that is less than a second frequency of the N phase signals. In a further embodiment, M is equal to 2N, and the first oscillation frequency is equal to the second frequency divided by 2.

In a further embodiment, the N phase signals are generated at block 1104 by the processing logic receiving, at a first logic gate, two or more of the M phase signals, and outputting a first intermediate signal. The processing logic receives, at a second logic gate, two or more of the M phase signals and outputs a second intermediate signal. The processing logic receives, at a third logic gate, the first intermediate signal and the second intermediate signal and outputs one of the N phase signals.

In a further embodiment, the N phase signals are generated at block 1104 by controlling an M-to-N multiplexer to select N outputs from M inputs at a time, where the M inputs are the M phase signals at a first oscillation frequency and the N outputs are the N phase signals at a second frequency, and the first oscillation frequency is less than the second frequency.

Other variations are within the spirit of the present disclosure. Thus, while disclosed techniques are susceptible to various modifications and alternative constructions, certain illustrated embodiments thereof are shown in drawings and have been described above in detail. It should be understood, however, that there is no intention to limit the disclosure to a specific form or forms disclosed, but on the contrary, the intention is to cover all modifications, alternative constructions, and equivalents falling within the spirit and scope of the disclosure, as defined in appended claims.

Use of terms "a" and "an" and "the" and similar referents in the context of describing disclosed embodiments (especially in the context of following claims) are to be construed to cover both singular and plural, unless otherwise indicated herein or clearly contradicted by context, and not as a definition of a term. Terms "comprising," "having," "including," and "containing" are to be construed as open-ended terms (meaning "including, but not limited to,") unless otherwise noted. "Connected," when unmodified and referring to physical connections, is to be construed as partly or wholly contained within, attached to, or joined together, even if there is something intervening. Recitations of ranges of values herein are merely intended to serve as a shorthand method of referring individually to each separate value falling within the range, unless otherwise indicated herein, and each separate value is incorporated into the specification as if it were individually recited herein. In at least one embodiment, the use of the term "set" (e.g., "a set of items") or "subset" unless otherwise noted or contradicted by context, is to be construed as a nonempty collection comprising one or more members. Further, unless otherwise noted or contradicted by context, the term "subset" of a corresponding set does not necessarily denote a proper subset of the corresponding set, but subset and corresponding set may be equal.

Conjunctive language, such as phrases of the form "at least one of A, B, and C," or "at least one of A, B and C," unless specifically stated otherwise or otherwise clearly contradicted by context, is otherwise understood with the context as used in general to present that an item, term, etc., may be either A or B or C, or any nonempty subset of the set of A and B and C. For instance, in an illustrative example of a set having three members, conjunctive phrases "at least one of A, B, and C" and "at least one of A, B and C" refer to any of the following sets: {A}, {B}, {C}, {A, B}, {A, C}, {B, C}, {A, B, C}. Thus, such conjunctive language is not generally intended to imply that certain embodiments require at least one of A, at least one of B and at least one of C each to be present. In addition, unless otherwise noted or contradicted by context, the term "plurality" indicates a state of being plural (e.g., "a plurality of items" indicates multiple items). In at least one embodiment, the number of items in a plurality is at least two but can be more when so indicated either explicitly or by context. Further, unless stated otherwise or otherwise clear from context, the phrase "based on" means "based at least in part on" and not "based solely on."

Operations of processes described herein can be performed in any suitable order unless otherwise indicated herein or otherwise clearly contradicted by context. In at least one embodiment, a process such as those processes described herein (or variations and/or combinations thereof) is performed under the control of one or more computer systems configured with executable instructions and is implemented as code (e.g., executable instructions, one or more computer programs or one or more applications) executing collectively on one or more processors, by hardware or combinations thereof. In at least one embodiment, code is stored on a computer-readable storage medium, for example, in the form of a computer program comprising a plurality of instructions executable by one or more processors. In at least one embodiment, a computer-readable storage medium is a non-transitory computer-readable storage medium that excludes transitory signals (e.g., a propagating transient electric or electromagnetic transmission) but includes non-transitory data storage circuitry (e.g., buffers, cache, and queues) within transceivers of transitory signals. In at least one embodiment, code (e.g., executable code or source code) is stored on a set of one or more non-transitory computer-readable storage media having stored thereon executable instructions (or other memory to store executable instructions) that, when executed (i.e., as a result of being executed) by one or more processors of a computer system, cause a computer system to perform operations described herein. In at least one embodiment, a set of non-transitory computer-readable storage media comprises multiple non-transitory computer-readable storage media and one or more individual non-transitory storage media of multiple non-transitory computer-readable storage media lacks all of the code while multiple non-transitory computer-readable storage media collectively store all of the code. In at least one embodiment, executable instructions are executed such that different instructions are executed by different processors.

Accordingly, in at least one embodiment, computer systems are configured to implement one or more services that singly or collectively perform operations of processes described herein, and such computer systems are configured with applicable hardware and/or software that enable the performance of operations. Further, a computer system that implements at least one embodiment of present disclosure is a single device and, in another embodiment, is a distributed computer system comprising multiple devices that operate differently such that distributed computer system performs operations described herein and such that a single device does not perform all operations.

Use of any and all examples or exemplary language (e.g., "such as") provided herein is intended merely to better illuminate embodiments of the disclosure and does not pose a limitation on the scope of the disclosure unless otherwise claimed. No language in the specification should be construed as indicating any non-claimed element as essential to the practice of the disclosure.

All references, including publications, patent applications, and patents, cited herein are hereby incorporated by reference to the same extent as if each reference were individually and specifically indicated to be incorporated by reference and were set forth in its entirety herein.

In description and claims, the terms "coupled" and "connected," along with their derivatives, may be used. It should be understood that these terms may not be intended as synonyms for each other. Rather, in particular examples, "connected" or "coupled" may be used to indicate that two or more elements are in direct or indirect physical or electrical contact with each other. "Coupled" may also mean that two or more elements are not in direct contact with each other, but yet still co-operate or interact with each other.

Unless specifically stated otherwise, it may be appreciated that throughout specification terms such as "processing," "computing," "calculating," "determining," or like, refer to action and/or processes of a computer or computing system, or similar electronic computing device, that manipulates and/or transform data represented as physical, such as electronic, quantities within computing system's registers and/or memories into other data similarly represented as physical quantities within computing system's memories, registers or other such information storage, transmission or display devices.

In a similar manner, the term "processor" may refer to any device or portion of a device that processes electronic data from registers and/or memory and transform that electronic data into other electronic data that may be stored in registers and/or memory. As a non-limiting example, a "processor" may be a network device. A "computing platform" may comprise one or more processors. As used herein, "software" processes may include, for example, software and/or hardware entities that perform work over time, such as tasks, threads, and intelligent agents. Also, each process may refer to multiple processes for continuously or intermittently carrying out instructions in sequence or parallel. In at least one embodiment, the terms "system" and "method" are used herein interchangeably insofar as the system may embody one or more methods, and methods may be considered a system.

In the present document, references may be made to obtaining, acquiring, receiving, or inputting analog or digital data into a subsystem, computer system, or computer-implemented machine. In at least one embodiment, the process of obtaining, acquiring, receiving, or inputting analog and digital data can be accomplished in a variety of ways, such as by receiving data as a parameter of a function call or a call to an application programming interface. In at least one embodiment, processes of obtaining, acquiring, receiving, or inputting analog or digital data can be accomplished by transferring data via a serial or parallel interface. In at least one embodiment, processes of obtaining, acquiring, receiving, or inputting analog or digital data can be accomplished by transferring data via a computer network from providing entity to acquiring entity. In at least one embodiment, references may also be made to providing, outputting, transmitting, sending, or presenting analog or digital data. In various examples, processes of providing, outputting, transmitting, sending, or presenting analog or digital data can be accomplished by transferring data as an input or output parameter of a function call, a parameter of an application programming interface, or an inter-process communication mechanism.

Although descriptions herein set forth example embodiments of described techniques, other architectures may be used to implement described functionality and are intended to be within the scope of this disclosure. Furthermore, although specific distributions of responsibilities may be defined above for purposes of description, various functions and responsibilities might be distributed and divided in different ways, depending on circumstances.

Furthermore, although the subject matter has been described in language specific to structural features and/or methodological acts, it is to be understood that subject matter claimed in appended claims is not necessarily limited to specific features or acts described. Rather, specific features and acts are disclosed as exemplary forms of implementing the claims.

What is claimed is:

1. A ring oscillator circuit comprising:
a ring oscillator comprising a set of M delay stages, each stage to output a phase signal, wherein M is a positive integer greater than one; and
a phase selector circuit coupled to the ring oscillator, wherein the phase selector circuit is to:
receive M phase signals from the ring oscillator; and
generate N phase signals from the M phase signals at a time, wherein N is a positive integer less than M and greater than one, wherein the ring oscillator comprises a first oscillation frequency that is less than a second frequency of the N phase signals.

2. The ring oscillator circuit of claim 1, wherein, to generate the N phase signals, the phase selector circuit is to reassemble rising edges of the M phase signals.

3. The ring oscillator circuit of claim 1, wherein, to generate the N phase signals, the phase selector circuit is to reassemble falling edges of the M phase signals.

4. The ring oscillator circuit of claim 1, wherein M is equal to 2N, wherein the first oscillation frequency is equal to the second frequency divided by 2.

5. The ring oscillator circuit of claim 1, wherein the phase selector circuit comprises:
a first logic gate to receive two or more of the M phase signals and to output a first intermediate signal;
a second logic gate to receive two or more of the M phase signals and to output a second intermediate signal; and
a third logic gate to receive the first intermediate signal and the second intermediate signal and to output one of the N phase signals.

6. The ring oscillator circuit of claim 5, wherein the first logic gate is an AND gate, the second logic gate is an AND gate, and the third logic gate is an OR gate.

7. The ring oscillator circuit of claim 5, wherein the first logic gate is a NAND gate, the second logic gate is a NAND gate, and the third logic gate is a NAND gate.

8. The ring oscillator circuit of claim 5, wherein the phase selector circuit comprises:
sequential logic; and
an M-to-N multiplexer coupled to the sequential logic, wherein the sequential logic is to control the M-to-N multiplexer to select N outputs from M inputs at a time, wherein the M inputs are the M phase signals at a first oscillation frequency and the N outputs are the N phase signals at a second frequency, wherein the first oscillation frequency is less than the second frequency.

9. The ring oscillator circuit of claim 1, further comprising:
a first voltage supply;
a current digital-to-analog converter (IDAC) coupled to the first voltage supply, the IDAC to provide a second voltage supply to the ring oscillator and the phase selector circuit, wherein the second voltage supply is lower than the first voltage supply; and
a set of N level shifters coupled to the phase selector circuit and the first voltage supply, the set of N level shifters to shift voltage levels of the N phase signals from a second level to a first level greater than the second level.

10. A Serializer/Deserializer (SERDES) system comprising:
a transmitter device comprising:
a serializer;
a phase-locked loop (PLL) coupled to the serializer, the PLL to provide a first set of N phase signals to the serializer, wherein the PLL comprises:
a first ring oscillator comprising a first set of M delay stages, each stage to output a phase signal, wherein M is a positive integer greater than one; and
a first phase selector circuit coupled to the first ring oscillator, wherein the first phase selector circuit is to:
receive a first set of M phase signals from the first ring oscillator; and
generate the first set of N phase signals from the first set of M phase signals at a time, wherein N is a positive integer less than M and greater than one, wherein the first ring oscillator comprises a first oscillation frequency that is less than a second frequency of the N phase signals.

11. The SERDES system of claim 10, further comprising a receiver device comprising:
a time-interleaved analog-to-digital converter (TI-ADC); and
a clock data recovery (CDR) circuit coupled to the TI-ADC, the CDR circuit to provide a second set of N phase signals to the TI-ADC, wherein the CDR circuit comprises:
a second ring oscillator comprising a second set of M delay stages, each stage to output a phase signal; and
a second phase selector circuit coupled to the second ring oscillator, wherein the second phase selector circuit is to:
receive a second set of M phase signals from the second ring oscillator; and
generate the second set of N phase signals based on the second set of M phase signals.

12. The SERDES system of claim 11, wherein:
the transmitter device further comprises a digital-to-analog converter (DAC) coupled to the serializer and a second PLL coupled to the PLL; and
the receiver device further comprises analog front-end (AFE) circuitry, a feed-forward equalizer (FFE), a phase detector (PD), and a digital loop filter (DLF).

13. A method of operating a ring oscillator circuit, the method comprising:
generating M phase signals using M delay stages of a ring oscillator; and
generating N phase signals from the M phase signals at a time, wherein N is a positive integer less than M and greater than one, wherein the ring oscillator comprises a first oscillation frequency that is less than a second frequency of the N phase signals.

14. The method of claim 13, wherein generating the N phase signals comprises reassembling rising edges of the M phase signals.

15. The method of claim 13, wherein generating the N phase signals comprises reassembling falling edges of the M phase signals.

16. The method of claim 13, wherein M is equal to 2N, wherein the first oscillation frequency is equal to the second frequency divided by 2.

17. The method of claim 13, wherein generating the N phase signals comprises:
receiving, at a first logic gate, two or more of the M phase signals and outputting a first intermediate signal;
receiving, at a second logic gate, two or more of the M phase signals and outputting a second intermediate signal; and receiving, at a third logic gate, the first intermediate signal and the second intermediate signal and outputting one of the N phase signals.

18. The method of claim 13, wherein generating the N phase signals comprises controlling an M-to-N multiplexer to select N outputs from M inputs at a time, wherein the M inputs are the M phase signals at a first oscillation frequency and the N outputs are the N phase signals at a second frequency, wherein the first oscillation frequency is less than the second frequency.

19. An apparatus comprising:
a ring oscillator to generate M phase signals, wherein M is a positive integer greater than one; and
a phase selector circuit comprising an M-to-N multiplexer coupled to the ring oscillator, wherein the M-to-N multiplexer is to receive the M phase signals from the ring oscillator and select N phase signals from the M phase signals, and wherein N is a positive integer less than M and greater than one, wherein the ring oscillator comprises a first oscillation frequency that is less than a second frequency of the N phase signals.

20. The apparatus of claim 19, wherein the phase selector circuit further comprises sequential logic coupled to the M-to-N multiplexer, wherein the sequential logic is to send a first phase-select signal to the M-to-N multiplexer to select the N phase signals from the M phase signals at a first time.

21. The apparatus of claim 20, wherein the ring oscillator is to generate additional M phase signals, wherein the M-to-N multiplexer is to receive the additional M phase signals, wherein the sequential logic is to send a second phase-select signal to the M-to-N multiplexer to select additional N phase signals from the additional M phase signals at a second time.

* * * * *